(12) United States Patent
Uetake

(10) Patent No.: US 6,872,999 B2
(45) Date of Patent: Mar. 29, 2005

(54) SEMICONDUCTOR STORAGE DEVICE WITH SIGNAL WIRING LINES RMED ABOVE MEMORY CELLS

(75) Inventor: Toshiyuki Uetake, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 105 days.

(21) Appl. No.: 10/612,992

(22) Filed: Jul. 7, 2003

(65) Prior Publication Data

US 2004/0004877 A1 Jan. 8, 2004

(30) Foreign Application Priority Data

Jul. 8, 2002 (JP) .......................................... 2002-198677

(51) Int. Cl.[7] .............................................. H01L 27/108
(52) U.S. Cl. ..................... 257/298; 257/296; 257/297; 257/488; 257/491; 257/666
(58) Field of Search ................................ 257/296, 297, 257/488, 491, 666

(56) References Cited

U.S. PATENT DOCUMENTS 5,808,334 A * 9/1998 Taguchi ...................... 257/296

FOREIGN PATENT DOCUMENTS

JP 9-74172 3/1997

* cited by examiner

*Primary Examiner*—David Nelms
*Assistant Examiner*—Mai-Huong Tran
(74) *Attorney, Agent, or Firm*—Westerman, Hattori, Daniels & Adrian, LLP

(57) ABSTRACT

Memory cells, word lines and bit lines are formed on the substrate. Each word line is connected to some memory cells. The bit line is disposed in a wiring layer above the word lines, the bit line being connected to some memory cells and applied with a signal read from the memory cell selected by the word lines. Signal wiring lines are disposed in a wiring layer above the bit lines and partially superposed upon the bit lines. A shield layer is disposed in a wiring layer between the bit lines and signal wiring lines. As viewed along a direction vertical to the surface of the semiconductor substrate, the shield layer includes the bit lines in an area including an area where the bit lines and signal wiring lines are superposed upon each other, openings being formed through the shield layer in areas where the bit lines are not disposed.

9 Claims, 6 Drawing Sheets

SEMICONDUCTOR STORAGE DEVICE WITH SIGNAL WIRING LINES RMED ABOVE MEMORY CELLS

CROSS REFERENCE TO RELATED APPLICATION

This application is based on and claims priority of Japanese Patent Application No. 2002-198677 filed on Jul. 8, 2002, the entire contents of which are incorporated herein by reference.

BACKGROUND OF THE INVENTION

A) Field of the Invention

The present invention relates to a semiconductor storage device, and more particularly to a semiconductor storage device having signal wiring lines formed above the region where memory cells are disposed.

B) Description of the Related Art

If signal wiring lines and the like are disposed above bit lines applied to which are signals read from memory cells of a semiconductor storage device, electric signals transmitted in the signal wiring lines generate noises in the bit lines. In order to prevent the generation of noises, signal wiring lines and the like have been conventionally designed not to be disposed above the memory cell region.

As the memory cell region becomes large because of a large capacity of a semiconductor storage device, an area where signal wiring lines cannot be disposed becomes broad. It is therefore necessary to enlarge the chip area or increase the number of wiring layers in order to allow necessary signal wiring lines to be disposed in an area other than the memory cell region.

Even if signal wiring lines are disposed above bit lines, the generation of noises in the bit lines can be prevented if a shield layer is disposed between the bit lines and signal wiring lines.

A conductive shield layer and an interlayer insulating film have different thermal expansion coefficients. Since the shield layer covers a broader area than other wiring patterns, a large stress is applied to the edge of the shield layer, resulting in a lower manufacture yield.

SUMMARY OF THE INVENTION

An object of this invention is to provide a semiconductor storage device capable of maintaining a high manufacture yield even if signal wiring lines are disposed above a memory cell region.

According to one aspect of the present invention, there is provided a semiconductor storage device comprising: a plurality of memory cells formed on a surface of a semiconductor substrate; a plurality of word lines formed on the surface of the semiconductor substrate, each of the word lines being connected to a plurality of memory cells and selecting memory cells connected to the word line upon application of a select signal to the word line; a plurality of bit lines disposed in a second wiring layer above a first wiring layer in which the word lines are disposed, the bit lines extending along a direction crossing the word lines, the bit line being connected to some of the memory cells and applied with a signal read from each of the memory cells selected by each of the word lines; a plurality of signal wiring lines crossing the bit lines and disposed in a third wiring layer above the second wiring layer; and a conductive shield line disposed in correspondence with each of the signal wiring lines, the conductive shield line being disposed in a fourth wiring layer between the second and third wiring layers and covering a corresponding signal wiring line as viewed along a direction vertical to the surface of the semiconductor substrate.

According to another aspect of the present invention, there is provided a semiconductor storage device comprising: a plurality of memory cells formed on or over a surface of a semiconductor substrate; a plurality of word lines formed on or over the surface of the semiconductor substrate, each of the word lines being connected to a plurality of memory cells and selecting memory cells connected to the word line upon application of a select signal to the word line; a plurality of bit lines disposed in a second wiring layer above a first wiring layer in which the word lines are disposed, the bit lines extending along a direction crossing the word lines, each of the bit lines being connected to some of the memory cells and applied with a signal read from the memory cell selected by the word lines; a plurality of signal wiring lines crossing the bit lines and disposed in a third wiring layer above the second wiring layer; and a conductive shield line disposed in correspondence with each of the signal wiring lines, the conductive shield line being disposed in a fourth wiring layer between the second and third wiring layers and including there-inside a corresponding signal wiring line as viewed along a direction vertical to the surface of the semiconductor substrate.

A shield layer or line reduces noises to be induced by electric signals transmitting in signal wiring lines. Since openings are formed through the shield layer, it is possible to mitigate the concentration of stress to be generated by a difference between thermal expansion coefficients of the shield layer and interlayer insulating film. Instead of covering the whole region where memory cells are disposed, narrow shield lines may be disposed to reduce the concentration of stress.

DESCRIPTION OF THE PREFERRED EMBODIMENTS

Figure 1:
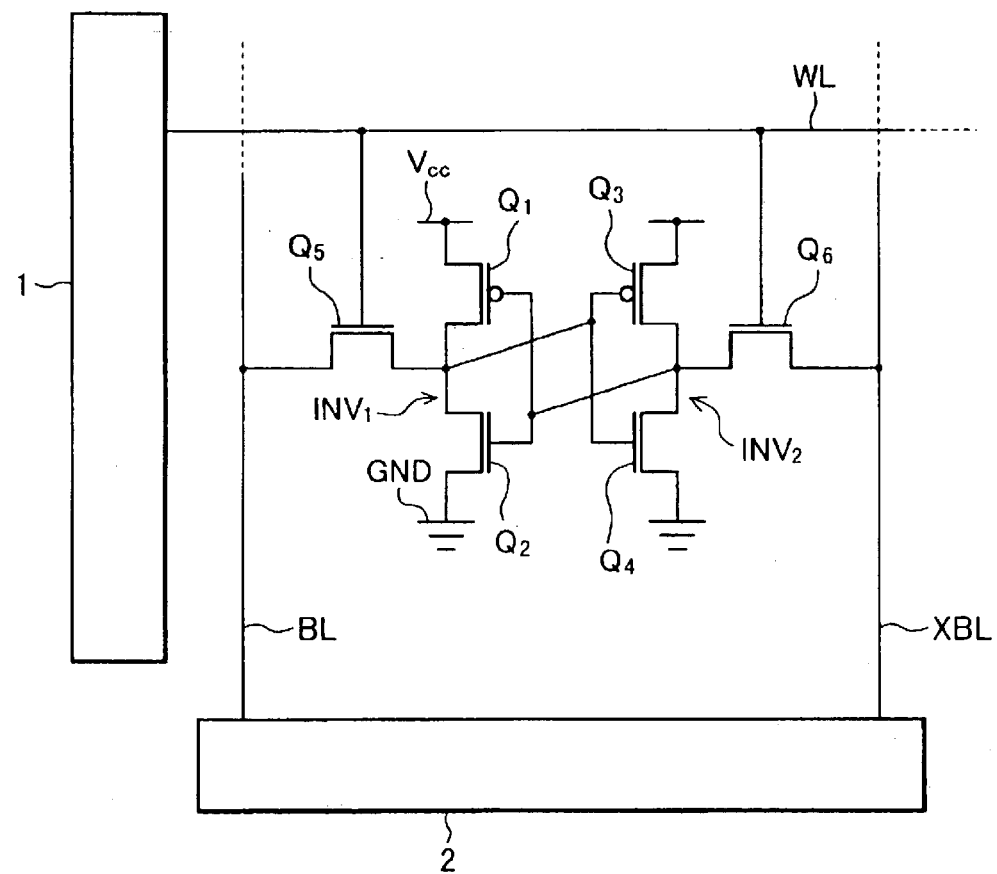
FIG. 1 is an equivalent circuit of one memory cell of a semiconductor storage device according to a first embodiment of the invention.

FIG. 1 is an equivalent circuit diagram of one memory cell of a semiconductor device according to an embodiment of the invention. A memory cell is made of six MOS transistors $Q_1$ to $Q_6$. A p-channel MOS transistor $Q_1$ and an n-channel MOS transistor $Q_2$ are serially connected to form an inverter $INV_1$, and a p-channel MOS transistor $Q_3$ and an n-channel MOS transistor $Q_4$ are serially connected to form an inverter $INV_2$.

Gate electrodes of the MOS transistors $Q_1$ and $Q_2$ are connected together and connected to a mutual connection point (an output point of the inverter $INV_2$) between the MOS transistors $Q_3$ and $Q_4$. Similarly, gate electrodes of the MOS transistors $Q_3$ and $Q_4$ are connected together and connected to a mutual connection point (an output point of the inverter $INV_1$) between the MOS transistors $Q_1$ and $Q_2$.

Source electrodes of the MOS transistors $Q_1$ and $Q_3$ are connected to a power source wiring line Vcc, and source electrodes of the MOS transistors $Q_2$ and $Q_4$ are connected to a ground wiring line GND. The output point of the inverter $INV_1$ is connected via an n-channel MOS transistor $Q_5$ to a bit line BL, and the output point of the inverter $INV_2$ is connected via an n-channel MOS transistor $Q_6$ to an inverted bit line XBL. Gate electrodes of the MOS transistors $Q_5$ and $Q_6$ are connected to the same word line WL.

The bit line BL and inverted bit line XBL disposed in parallel constitute a single bit line pair. A plurality of bit line pairs and word lines WL are disposed and cross each other. At each cross point a memory cell is disposed.

The word lines WL are connected to a word line driver 1, and the bit lines BL and inverted bit lines XBL are connected to a sense amplifier 2.

As a select signal is applied to the word line WL, memory cells connected to the word line WL are selected. Information stored in the selected memory cells is read to the bit lines BL and inverted bit lines XBL connected to the selected memory cells and transmitted to the sense amplifier 2.

Figure 2A:
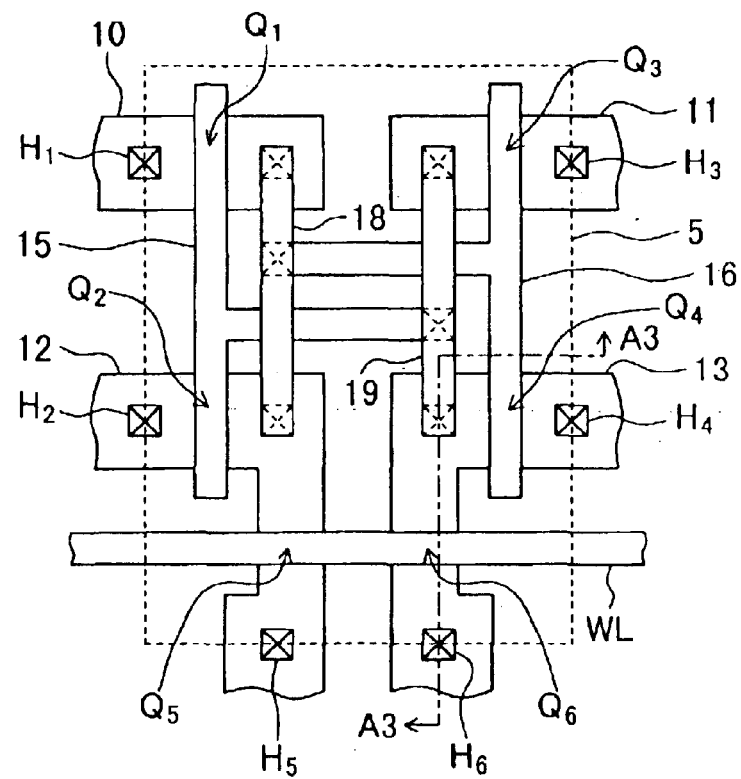
FIGS. 2A and 2B are schematic plan views of one memory cell of the semiconductor storage device of the first embodiment.
Figure 2B:
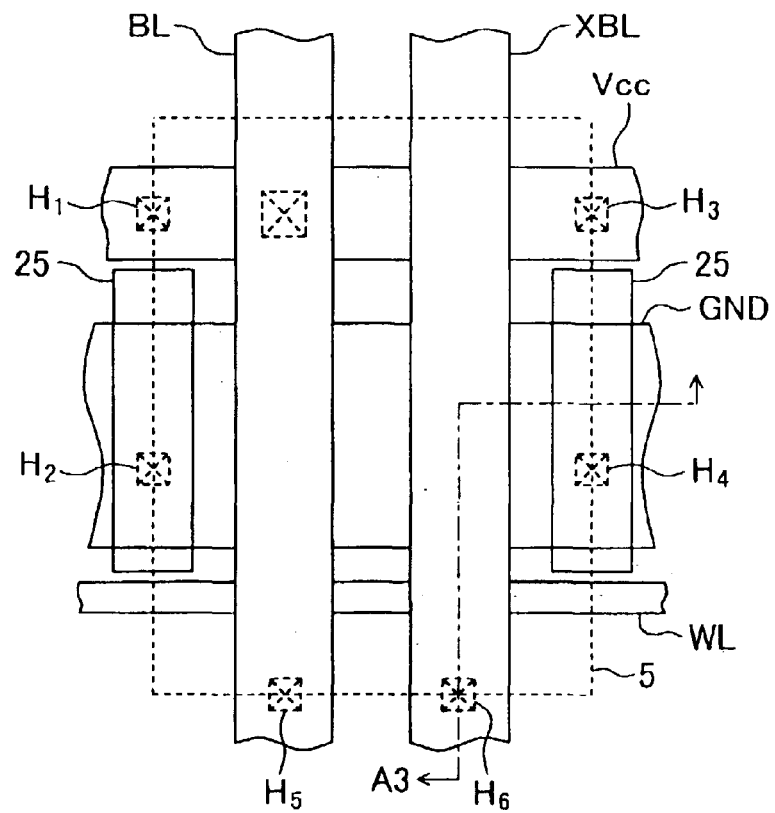

FIGS. 2A and 2B are schematic plan views of one memory cell. A plurality of memory cells having the same pattern as, or an axisymmetric pattern of, that of the memory cell shown in FIG. 2A is repetitively disposed along row and column directions shown in FIG. 2B. Four active regions 10 to 13 are defined in one memory cell region 5. The active regions 10 and 11 are disposed in an n-type well, and the active regions 12 and 13 are disposed in a p-type well. A first gate electrode 15 traverses the active regions 10 and 12, and a second gate electrode 16 traverses the active regions 11 and 13.

The p-channel MOS transistor $Q_1$ is formed in a cross area between the active region 10 and first gate electrode 15, and the n-channel MOS transistor $Q_2$ is formed in a cross area between the active region 12 and first gate electrode 15. The p-channel MOS transistor $Q_3$ is formed in a cross area between the active region 11 and second gate electrode 16, and the n-channel MOS transistor $Q_4$ is formed in a cross area between the active region 13 and second gate electrode 16.

The word line WL traverses the active regions 12 and 13. The n-channel MOS transistor $Q_5$ is formed in a cross area between the word line WL and active region 12, and the n-channel MOS transistor $Q_6$ is formed in a cross area between the word line WL and active region 13. The MOS transistors $Q_2$ and $Q_4$ share the same drain region, and the MOS transistor $Q_4$ and $Q_6$ share the same drain region.

A first interconnect line 18 disposed in the first wiring layer interconnects the drain regions of the MOS transistors $Q_1$ and $Q_2$. The first interconnect line 18 is connected to the second gate electrode 16. A second interconnect line 19 disposed in the first wiring layer interconnects the drain regions of the MOS transistors $Q_3$ and $Q_4$. The second interconnect line 19 is connected to the first gate electrode 15.

Via holes $H_1$ to $H_4$ for the connection to upper layer wiring lines are disposed in the source regions of the MOS transistors $Q_1$ to $Q_4$. Via holes $H_5$ and $H_6$ for the connection to upper layer wiring lines are disposed in the source regions of the MOS transistors $Q_5$ to $Q_6$.

FIG. 2B is a schematic plan view of second and higher level wiring layers. In the second wiring layer, the power source wiring line Vcc and ground wiring line GND are disposed. The power source wiring line Vcc is connected to the source regions of the MOS transistors $Q_1$ and $Q_3$ via the via holes $H_1$ and $H_3$, respectively. The ground wiring line GND is connected to the source regions of the MOS transistors $Q_2$ and $Q_4$ via the via holes $H_2$ and $H_4$, respectively.

In the third wiring layer, the bit line BL and inverted bit line XBL are disposed. The bit line BL is connected to the source region of the MOS transistor $Q_5$ via the via hole $H_5$. The inverted bit line XBL is connected to the source region of the MOS transistor $Q_6$ via the via hole $H_6$. The bit line BL and inverted bit line XBL extend along the direction (vertical direction in FIG. 2B) perpendicular to the word line WL.

In the fourth wiring layer, a conductive shield layer having openings 25 is disposed. The openings 25 are disposed in areas not superposing upon the bit line BL and inverted bit line XBL. In the example shown in FIG. 2B, the opening 25 is disposed in the area where the boundary of the memory cell region 5 and the ground wiring line GND cross. The memory cell region 5 where the openings 25 are not disposed is covered with the shield layer.

In the fifth wiring layer, signal wiring lines (not shown in FIG. 2B) to be described later are disposed.

Figure 3:
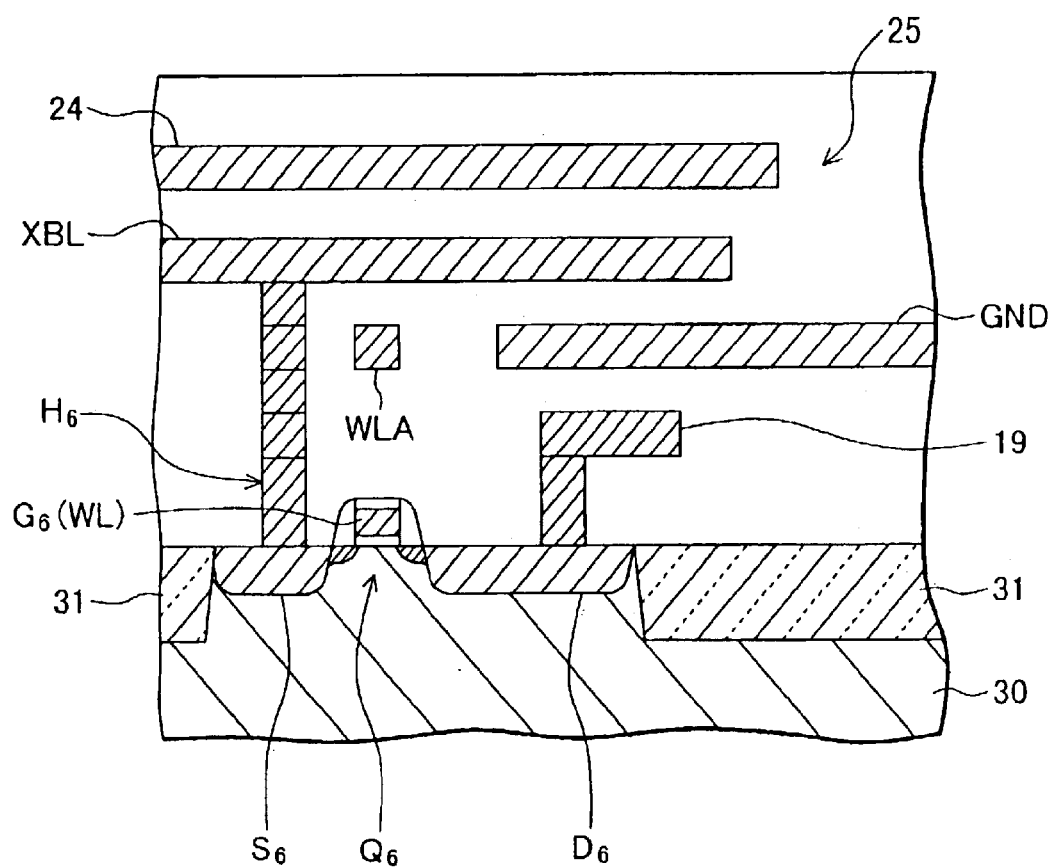
FIG. 3 is a cross sectional view of one memory cell of the semiconductor storage device of the first embodiment.

FIG. 3 is a cross sectional view taken along one-dot chain line A3—A3 shown in FIGS. 2A and 2B. In a surface layer of a silicon substrate 30, an element separation insulating film 31 is formed by shallow trench isolation to define active regions. In an active region, the MOS transistor $Q_6$ is formed. The MOS transistor $Q_6$ is constituted of a source region $S_6$, a drain region $D_6$ and a gate electrode $G_6$. A portion of the word line WL is used as the gate electrode $G_6$. For example, the word line WL has the two-layer structure of a polysilicon layer and a silicide layer of refractory metal.

A multilevel wiring layer structure is formed on the surface of the silicon substrate 30. The multilevel wiring layer structure can be formed by well-known film forming methods, photolithography, etching, chemical mechanical polishing (CMP) and the like. Wiring lines are made of aluminum, copper or the like. Copper wiring lines are formed by a damascene or dual damascene method.

In the first wiring layer, the second interconnect line 19 is disposed. The second interconnect line 19 is connected to the drain region $D_6$ of the MOS transistor $Q_6$ via a conductive plug made of tungsten. In the second wiring layer, the ground wiring line GND is disposed. An auxiliary word line WLA is disposed above and along the word line WL. The auxiliary word line WLA is connected to the word line WL via plugs disposed at a plurality of positions to lower the effective resistance of the word line WL.

In the third wiring layer, the inverted bit line XBL is disposed. The inverted bit line XBL is connected to the source region $S_6$ of the MOS transistor $Q_6$ via the conductive plug filled in the via hole $H_6$ and a conductive intermediate layer disposed in the underlying wiring layers. In the fourth layer, the shield layer 24 is disposed. The shield layer 24 is connected to the ground wiring layer GND or the power source wiring line Vcc shown in FIG. 2B. The shield layer 24 may be applied with a constant voltage by connecting it to a constant voltage generator formed on the silicon substrate.

The thickness of a wiring line in each of the first to third wiring layers is 600 nm, and the thickness of a wiring line in the fourth wiring layer is 900 nm. The thickness of an insulating film between wiring layers is 800 nm.

Figure 4:
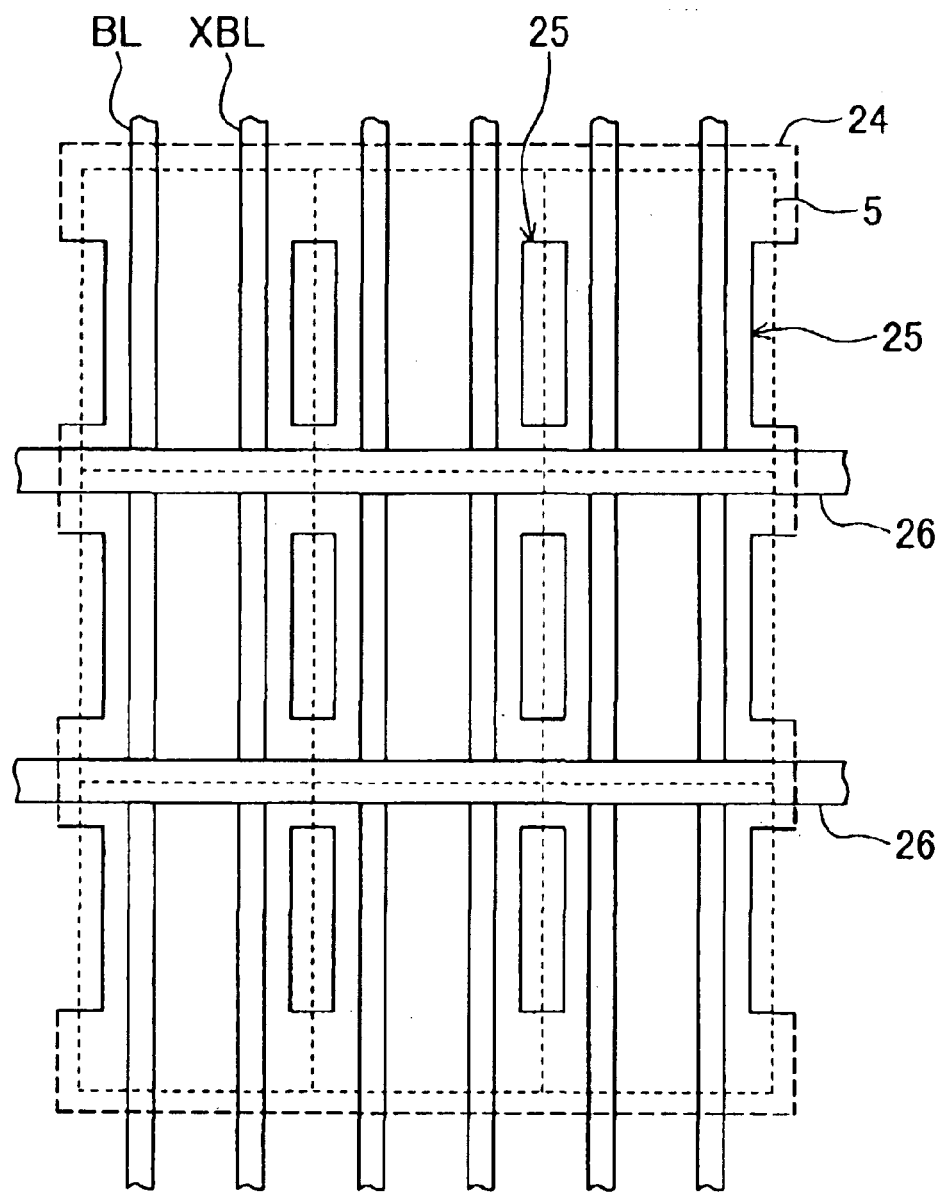
FIG. 4 is a plan view showing the third wiring layer and higher level wiring layers of the semiconductor storage device of the first embodiment.

FIG. 4 is a plan view showing a plurality of memory cell regions 5. In FIG. 4, patterns of the third and higher level wiring layer are shown. The memory cell regions 5 are disposed in a matrix shape. The bit line BL and inverted bit line XBL are disposed along each column of the memory cell regions 5. The shield layer 24 is disposed superposed upon the bit lines BL and inverted bit lines XBL. The openings 25 formed through the shield layer 24 are disposed along the boundary between adjacent two memory cell regions 5 along the row direction, so as not to be superposed upon the bit lines BL and inverted bit lines XBL.

In the fifth wiring layer above the shield layer 24, a plurality of signal wiring lines 26 are disposed. The signal wiring line 25 extends along the direction crossing the bit lines BL and inverted bit lines XBL and disposed not superposed upon the openings 25 formed through the shield layer 24.

In the area inclusive of the area where the signal wiring lines 26 and the bit lines BL and inverted bit lines XBL cross, the shield layer 24 covers the bit lines BL and inverted bit lines XBL, as viewed along the direction vertical to the surface of the silicon substrate. The shield layer 24 fixed to a constant potential is disposed between the signal wiring lines 26 and the bit lines BL and inverted bit lines XBL. Therefore, the bit lines BL and inverted bit lines XBL are hard to be affected by electric signals transmitted in the signal wiring lines 26. Noises to be generated in the bit lines BL and inverted bit lines XBL can therefore be reduced.

Since the openings 25 are formed through the shield layer 24, it is possible to mitigate the concentration of stress to be generated by a difference between thermal expansion coefficients of the shield layer 24 and interlayer insulating film.

In order to reduce noises to be generated in the bit lines BL and inverted bit lines XBL by electric signals transmitting in the signal wiring lines 26, it is preferable that the shield layer 24 is disposed at least in the areas where the signal wiring lines 26 and bit lines BL cross and the signal lines 26 and inverted bit lines XBL cross. In the memory cell region 5 where the signal wiring lines 26 do not traverse, it is not necessarily required that the bit lines BL and inverted bit lines XBL are covered with the shield layer.

Figure 5:
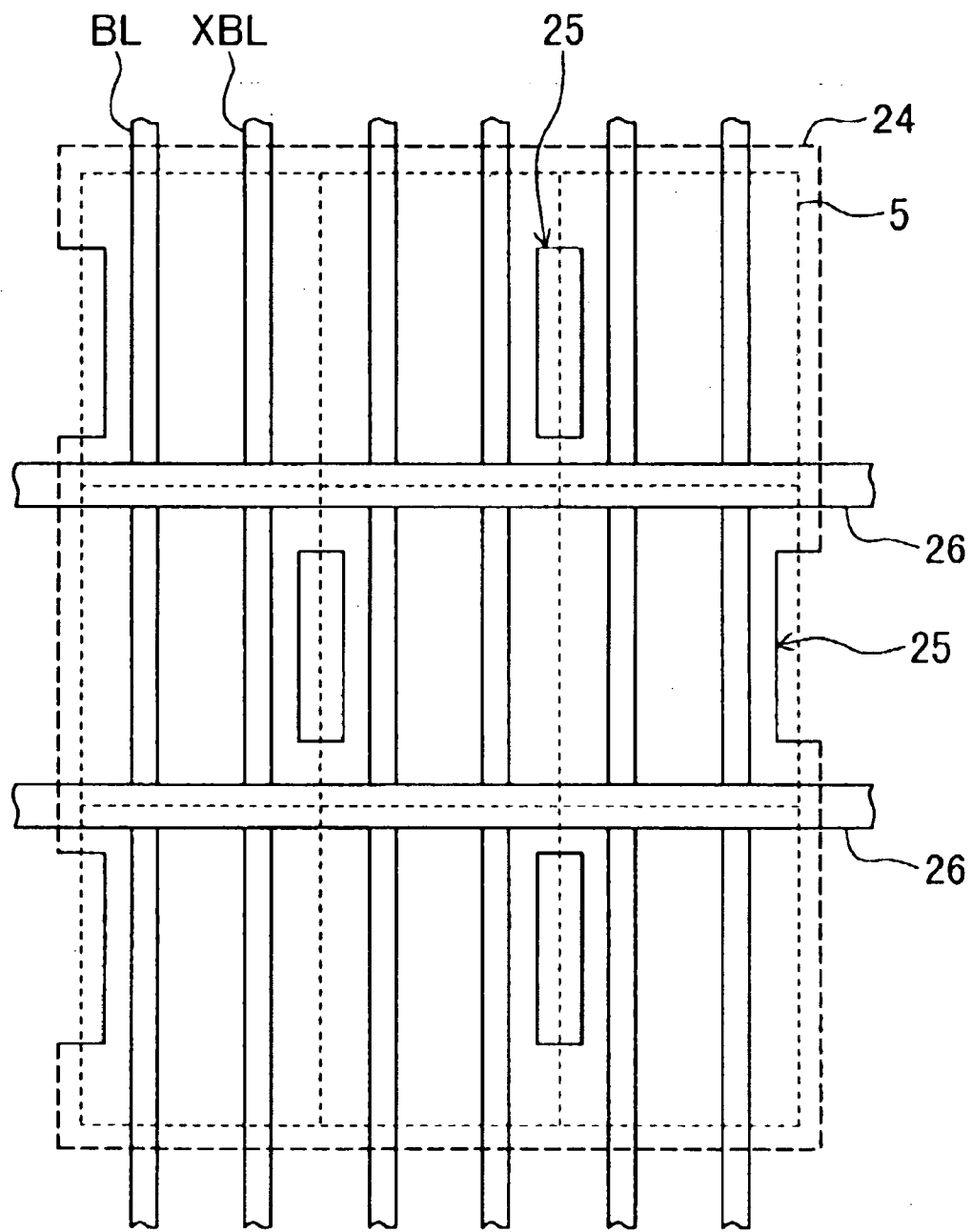
FIG. 5 is a plan view showing the third wiring layer and higher level wiring layers of a semiconductor storage device according to a modification of the first embodiment.

FIG. 5 is a schematic plan view of a semiconductor storage device according to a modification of the first embodiment. In the first embodiment shown in FIG. 4, the openings 25 are disposed in correspondence with all the boundaries between adjacent two memory cell regions 5 in the row direction. In the modification, openings 25 are disposed in correspondence with not all the boundaries but only some boundaries. For example, the openings 25 are disposed along each row of the memory cell regions 5 at every second boundaries. Along adjacent two rows, the openings 25 are disposed in different columns.

The openings 25 are disposed at the density necessary for mitigating the concentration of stress.

Figure 6:
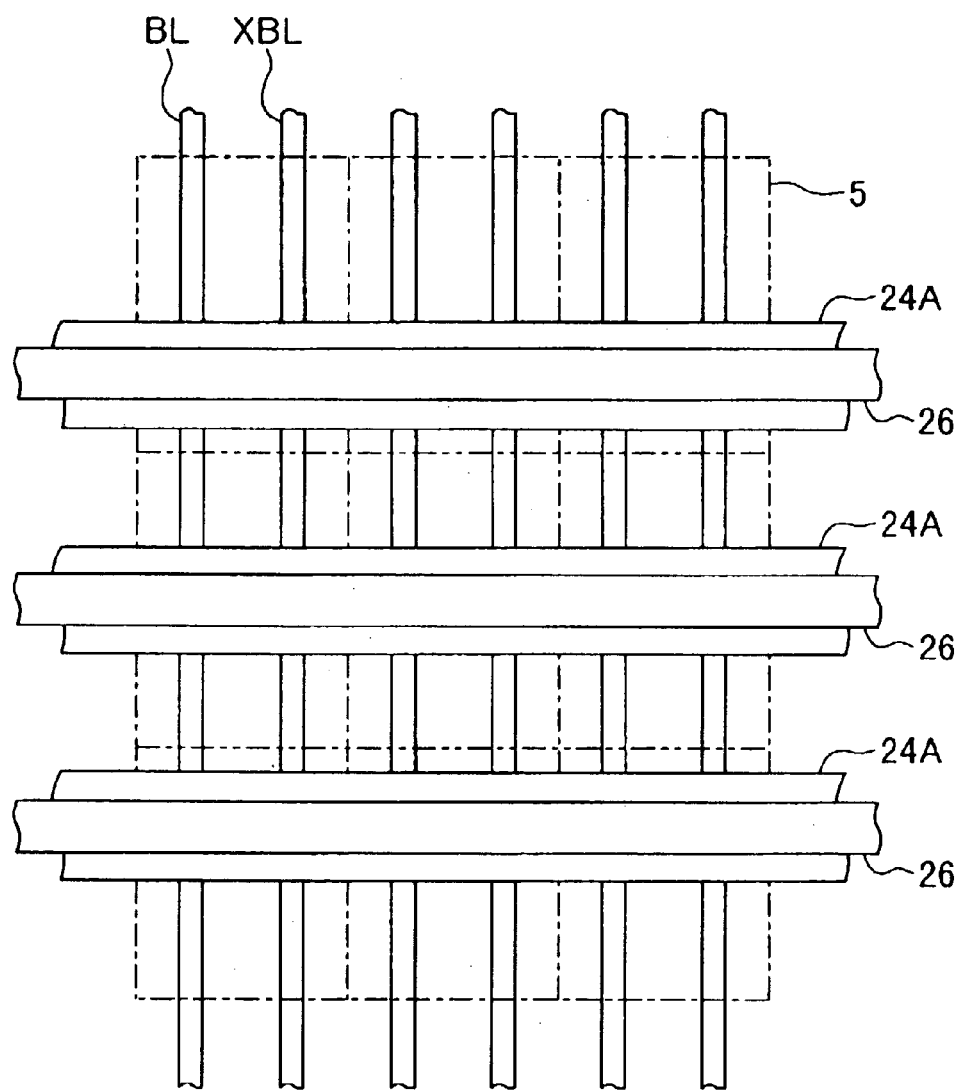
FIG. 6 is a plan view showing the third wiring layer and higher level wiring layers of a semiconductor storage device according to a second embodiment.

FIG. 6 is a schematic plan view of a semiconductor storage device according to a second embodiment of the invention. The layout of memory cell regions 5, bit lines BL and inverted bit lines XBL is similar to that of those of the semiconductor storage device of the first embodiment shown in FIG. 4. A signal wiring line 26 is disposed in correspondence with each row of the memory cell regions 5. The layout of the signal wiring lines 26 does not suggest particular meanings and the signal wiring lines 26 may be disposed along the boundary between adjacent two memory cell regions 5 in the column direction, like the first embodiment shown in FIG. 4.

A shield line 24A is disposed in the fourth wiring layer between the third wiring layer in which the bit lines BL and inverted bit lines XBL are disposed and the fifth wiring layer in which the signal wiring lines 26 are disposed. The shield line 24A is disposed in correspondence with each signal wiring line 26 and, covers the corresponding signal wiring line 26 as viewed along a direction vertical to the surface of the silicon substrate. Namely, the shield line 24A is bolder than the corresponding signal wiring line 26. Similar to the shield layer 24 of the first embodiment, the shield line 24A is connected to the ground wiring line GND, power source wiring line Vcc or constant voltage generator.

Also in the second embodiment, since the shield line 24A fixed to the constant potential is disposed between the bit line BL and signal wiring line 26 and between the inverted wiring line XBL and signal wiring line 26, noises to be induced in the bit lines BL and inverted bit lines XBL can be reduced.

The present invention has been described in connection with the preferred embodiments. The invention is not limited only to the above embodiments. It is apparent that various modifications, improvements, combinations, and the like can be made by those skilled in the art.

I claim:

1. A semiconductor storage device comprising:
   a plurality of memory cells formed on or over a surface of a semiconductor substrate;
   a plurality of word lines formed on or over the surface of the semiconductor substrate, each of the word lines being connected to some of the memory cells and selecting memory cells connected to the word line upon application of a select signal to the word line;
   a plurality of bit lines disposed in a second wiring layer above a first wiring layer in which the word lines are disposed, the bit lines extending along a direction crossing the word lines, each of the bit lines being connected to some of the memory cells and applied with a signal read from the memory cell selected by the word line;
   a plurality of signal wiring lines partially superposed upon the bit lines and disposed in a third wiring layer above the second wiring layer; and
   a conductive shield layer disposed in a fourth wiring layer between the second and third wiring layers, the conductive shield layer including there-inside the bit lines in a first area including an area where the bit lines and the signal wiring lines are superposed upon each other, as viewed along a direction vertical to the surface of the semiconductor substrate, openings being formed through the conductive shield layer in areas where the bit lines are not disposed.

2. A semiconductor storage device according to claim 1, wherein the openings are disposed in areas which are not superposed upon the signal wiring lines.

3. A semiconductor storage device according to claim 1, further comprising a power source wiring line and a ground wiring line formed on or over the semiconductor substrate, wherein the shield layer is connected to the power source wiring line or the ground wiring line.

4. A semiconductor storage device according to claim 2, further comprising a power source wiring line and a ground wiring line formed on or over the semiconductor substrate, wherein the shield layer is connected to the power source wiring line or the ground wiring line.

5. A semiconductor storage device according to claim 1, further comprising a constant voltage generator formed on or over the semiconductor substrate, wherein a constant voltage generated by the constant voltage generator is applied to the shield layer.

6. A semiconductor storage device according to claim 2, further comprising a constant voltage generator formed on or over the semiconductor substrate, wherein a constant voltage generated by the constant voltage generator is applied to the shield layer.

7. A semiconductor storage device comprising:

a plurality of memory cells formed on or over a surface of a semiconductor substrate;

a plurality of word lines formed on or over the surface of the semiconductor substrate, each of the word lines being connected to some of the memory cells and selecting memory cells connected to the word line upon application of a select signal to the word line;

a plurality of bit lines disposed in a second wiring layer above a first wiring layer in which the word lines are disposed, the bit lines extending along a direction crossing the word lines, each of the bit lines being connected to some of the memory cells and applied with a signal read from the memory cell selected by the word line;

a plurality of signal wiring lines crossing the bit lines and disposed in a third wiring layer above the second wiring layer; and a conductive shield line disposed in correspondence with each of the signal wiring lines, the conductive shield line being disposed in a fourth wiring layer between the second and third wiring layers and including thereinside a corresponding signal wiring line as viewed along a direction vertical to the surface of the semiconductor substrate.

8. A semiconductor storage device according to claim 7, further comprising a power source wiring line and a ground wiring line formed on or over the semiconductor substrate, wherein the conductive shield line is connected to the power source wiring line or the ground wiring line.

9. A semiconductor storage device according to claim 7, further comprising a constant voltage generator formed on or over the semiconductor substrate, wherein a constant voltage generated by the constant voltage generator is applied to the conductive shield line.

* * * * *